United States Patent
Yanagisawa

(10) Patent No.: US 8,054,587 B2
(45) Date of Patent: Nov. 8, 2011

(54) MAGNETORESISTIVE EFFECT ELEMENT, THIN-FILM MAGNETIC HEAD WITH MAGNETORESISTIVE EFFECT READ HEAD ELEMENT, AND MAGNETIC DISK DRIVE APPARATUS WITH THIN-FILM MAGNETIC HEAD

(75) Inventor: Takumi Yanagisawa, Tokyo (JP)

(73) Assignee: TDK Corporation, Tokyo (JP)

( * ) Notice: Subject to any disclaimer, the term of this patent is extended or adjusted under 35 U.S.C. 154(b) by 531 days.

(21) Appl. No.: 12/351,311

(22) Filed: Jan. 9, 2009

(65) Prior Publication Data
US 2010/0177447 A1      Jul. 15, 2010

(51) Int. Cl.
*G09B 5/04*      (2006.01)
(52) U.S. Cl. ............... 360/324.12; 360/324; 360/324.11
(58) Field of Classification Search .................. 360/324, 360/324.1, 324.11, 324.12, 319
See application file for complete search history.

(56) References Cited

U.S. PATENT DOCUMENTS

| 7,365,949 | B2 | 4/2008 | Hayakawa et al. |
| 7,428,127 | B2 * | 9/2008 | Nagasaka et al. ........... 360/324.1 |
| 7,440,241 | B2 * | 10/2008 | Hoshino et al. ........... 360/324.12 |
| 7,957,108 | B2 * | 6/2011 | Chou et al. .................. 360/324.2 |
| 2002/0036874 | A1 * | 3/2002 | Inage et al. .................... 360/322 |
| 2004/0207960 | A1 | 10/2004 | Saito et al. |

FOREIGN PATENT DOCUMENTS

| JP | A-2000-348307 | 12/2000 |
| JP | A-2007-080904 | 3/2007 |

* cited by examiner

*Primary Examiner* — Gene Auduong
(74) *Attorney, Agent, or Firm* — Oliff & Berridge, PLC

(57) ABSTRACT

An MR element includes a lower shield layer, a magnetization free function part stacked on the lower shield layer, an upper shield layer stacked on the magnetization free function part, a nonmagnetic intermediate layer stacked on a surface, that is opposite to a magnetically sensitive surface, of the magnetization free function part, and a magnetization fixed function part stacked on the nonmagnetic intermediate layer. The nonmagnetic intermediate layer and the magnetization fixed function part are formed only within an outer region of the magnetization free function part, located opposite side to the magnetically sensitive surface.

25 Claims, 6 Drawing Sheets

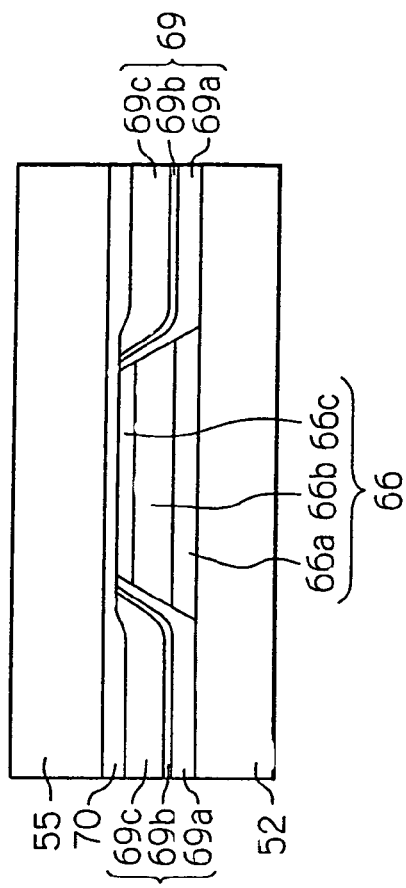

MAGNETORESISTIVE EFFECT ELEMENT, THIN-FILM MAGNETIC HEAD WITH MAGNETORESISTIVE EFFECT READ HEAD ELEMENT, AND MAGNETIC DISK DRIVE APPARATUS WITH THIN-FILM MAGNETIC HEAD

BACKGROUND OF THE INVENTION

1. Field of the Invention

The present invention relates to a magnetoresistive effect (MR) element for reading a signal representing a magnetic field intensity in a magnetic recording medium, to a thin-film magnetic head with an MR read head element, and to a magnetic disk drive apparatus with the thin-film magnetic head.

2. Description of the Related Art

In order to satisfy demand for higher recording density and downsizing in a hard disk drive (HDD) apparatus, higher sensitivity and larger output of a thin-film magnetic head are required. In order to meet this requirement, a thin-film magnetic head with a giant magnetoresistive effect (GMR) read head element has been put to practical use and a thin-film magnetic head with a tunnel magnetoresistive effect (TMR) read head element is now achieved to come into practical use.

In the thin-film magnetic head with such GMR read head element or TMR read head element, it is now tried to more narrow a space between lower and upper shield layers, that is a read gap, of the read head element in order to attain a higher density recording.

Each of US Patent Publication No. 2004/0207960 A1 and U.S. Pat. No. 7,365,949 B2 discloses a GMR thin-film magnetic head with a decreased thickness over its whole area by extending a pinned layer toward a height direction directed opposite to the air bearing surface (ABS) so as to fix a magnetization direction of the pinned layer with the help of shape anisotropy, and by positioning a pinning layer or anti-ferromagnetic layer at the outside in the height direction of a region in which a free layer, a non-magnetic layer and the pinned layer are arranged.

However, it was insufficient to fix the magnetization direction of the pinned layer only with the help of shape anisotropy. Also, it was difficult to stably fix the magnetization direction of the pinned layer under the influence of magnetic bias from magnetic domain control layers located near the pinned layer.

SUMMARY OF THE INVENTION

It is therefore an object of the present invention to provide an MR element with a new structure having a narrower read gap and being capable of more stably fixing the magnetization of a pinned layer, a thin-film magnetic head having an MR read head element, and a magnetic disk drive apparatus including the thin-film magnetic head.

According to the present invention, an MR element includes a lower shield layer, a magnetization free function part stacked on the lower shield layer, an upper shield layer stacked on the magnetization free function part, a nonmagnetic intermediate layer stacked on a surface, that is opposite to a magnetically sensitive surface, of the magnetization free function part, and a magnetization fixed function part stacked on the nonmagnetic intermediate layer. The nonmagnetic intermediate layer and the magnetization fixed function part are formed only within an outer region of the magnetization free function part, located opposite side to the magnetically sensitive surface.

Also, according to the present invention, a thin-film magnetic head includes an MR read head element having a lower shield layer, a magnetization free function part stacked on the lower shield layer, an upper shield layer stacked on the magnetization free function part, a nonmagnetic intermediate layer stacked on a surface, that is opposite to a magnetically sensitive surface, of the magnetization free function part, and a magnetization fixed function part stacked on the nonmagnetic intermediate layer. The nonmagnetic intermediate layer and the magnetization fixed function part are formed only within an outer region of the magnetization free function part, located opposite side to the magnetically sensitive surface.

According to the present invention, further, a magnetic disk drive apparatus includes a magnetic disk, at least one thin-film magnetic head, and a support mechanism for supporting the at least one thin-film magnetic head so as to face a surface of the magnetic disk. The at least one thin-film magnetic head includes a lower shield layer, a magnetization free function part stacked on the lower shield layer, an upper shield layer stacked on the magnetization free function part, a nonmagnetic intermediate layer stacked on a surface, that is opposite to a magnetically sensitive surface, of the magnetization free function part, and a magnetization fixed function part stacked on the nonmagnetic intermediate layer. The nonmagnetic intermediate layer and the magnetization fixed function part are formed only within an outer region of the magnetization free function part, located opposite side to the magnetically sensitive surface.

Since the nonmagnetic intermediate layer and the magnetization fixed function part are formed only within an outer region (rear side region in the height direction) of the magnetization free function part, located opposite side to the magnetically sensitive surface, a thickness of the magnetization fixed function part has a little effect on a read gap, so that the read gap can be more narrowed. Also, because bias magnetic field from magnetic domain control bias function parts formed at the side regions in the track-width direction is hardly applied to the magnetization fixed function part and because a magnetic field from the magnetization fixed function part is hardly applied to the magnetic domain control bias function parts, the fixing magnetization in the magnetization fixed function part in particular in a pinned layer can be more stabilized. As are result, excellent element output characteristics can be obtained.

It is preferred that the MR element is configured so that a sense current flows through the magnetization fixed function part, the nonmagnetic intermediate layer, the magnetization free function part and the lower shield layer.

It is also preferred that the magnetization fixed function part includes a pinned layer stacked on the nonmagnetic intermediate layer, and a pinning layer stacked on the pinned layer and exchange-coupled with the pinned layer.

It is further preferred that the nonmagnetic intermediate layer includes a nonmagnetic intermediate layer also serving as a lower insulation layer stacked on the surface, that is opposite to the magnetically sensitive surface, of the magnetization free function part and on the lower shield layer.

It is still further preferred that the nonmagnetic intermediate layer includes a tunnel barrier layer or a conductive spacer layer.

It is further preferred that the magnetization free function part includes a free buffer layer stacked on the lower shield layer, a free layer stacked on the free buffer layer and an upper insulation layer stacked on the free layer.

It is further preferred that the MR element further includes magnetic domain control bias function parts stacked on both side end surfaces of the magnetization free function part in a track-width direction. In this case, preferably, each of the magnetic domain control bias function parts includes a bias insulation layer, a bias buffer layer stacked on the bias insulation layer and a bias layer stacked on the bias buffer layer.

It is still further preferred that the MR element further includes a gap adjustment layer stacked between the magnetization fixed function part and the upper shield layer. In this case, more preferably, the gap adjustment layer is formed also between the magnetization free function part and the upper shield layer and between the magnetic domain control bias function part and the upper shield layer.

It is further preferred that the thin-film magnetic head further includes an inductive write head element formed on the upper shield layer of the MR read head element.

Other objects and advantages of the present invention will become apparent from the following description of preferred embodiment of the present invention with reference to accompanying drawings.

BRIEF DESCRIPTION OF THE DRAWINGS

FIGS. 6a and 6b are a central cross sectional view and a sectional view seen from the ABS side, schematically illustrating the structure of an MR read head element part of the composite thin-film magnetic head of FIG. 3.

DESCRIPTION OF THE PREFERRED EMBODIMENT

Figure 1:
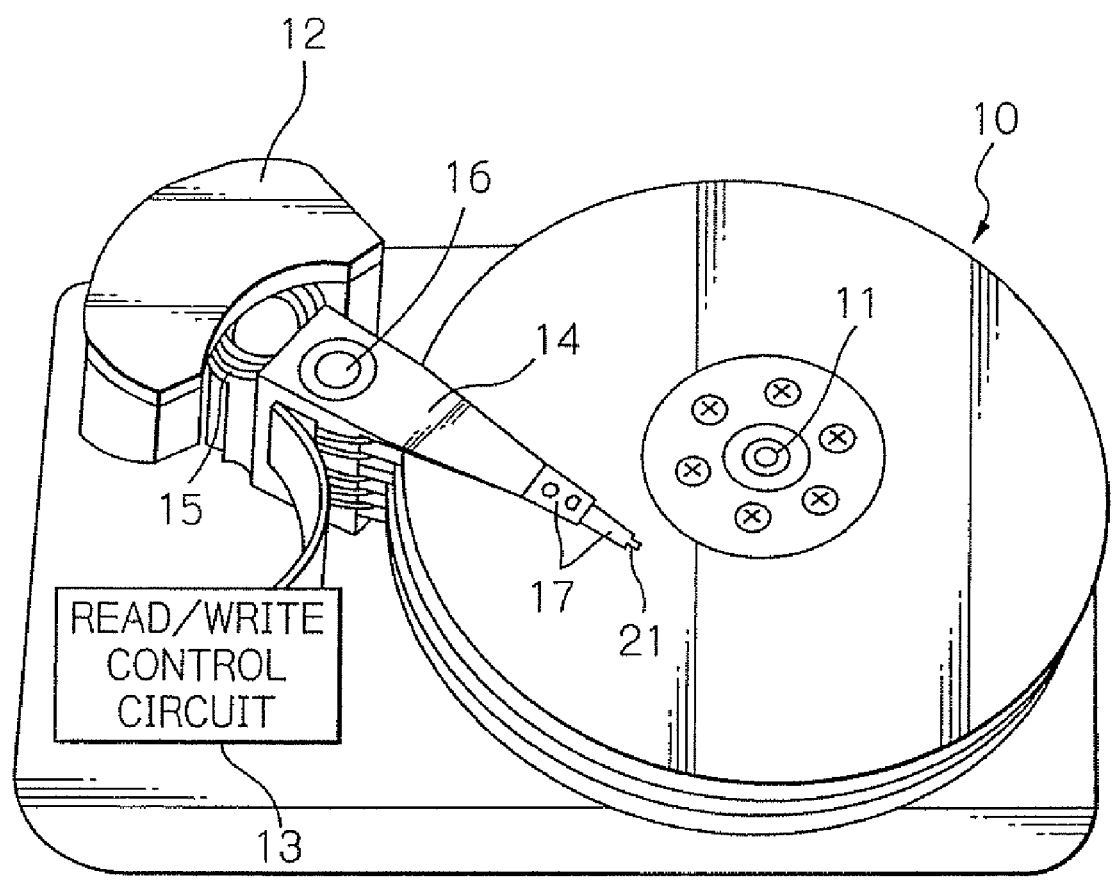
FIG. 1 is a perspective view schematically illustrating the main structure of a magnetic disk drive apparatus as an embodiment according to the present invention.
Figure 2:
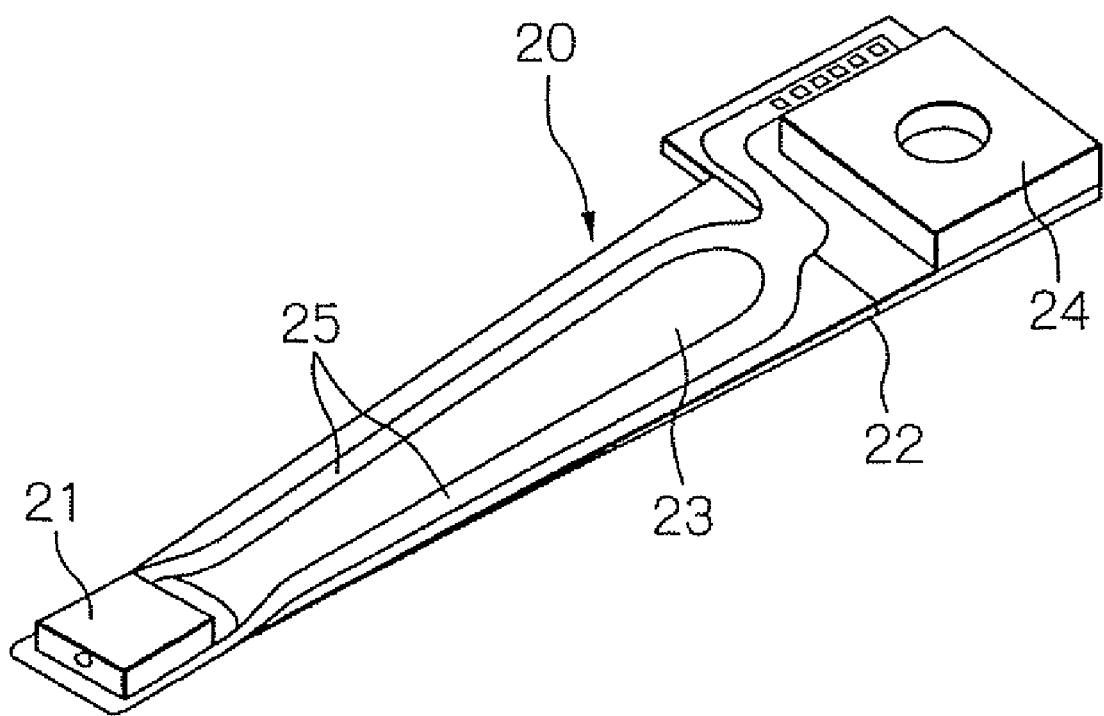
FIG. 2 is a perspective view illustrating an example of the structure of a head gimbal assembly (HGA) shown in FIG. 1.
Figure 3:
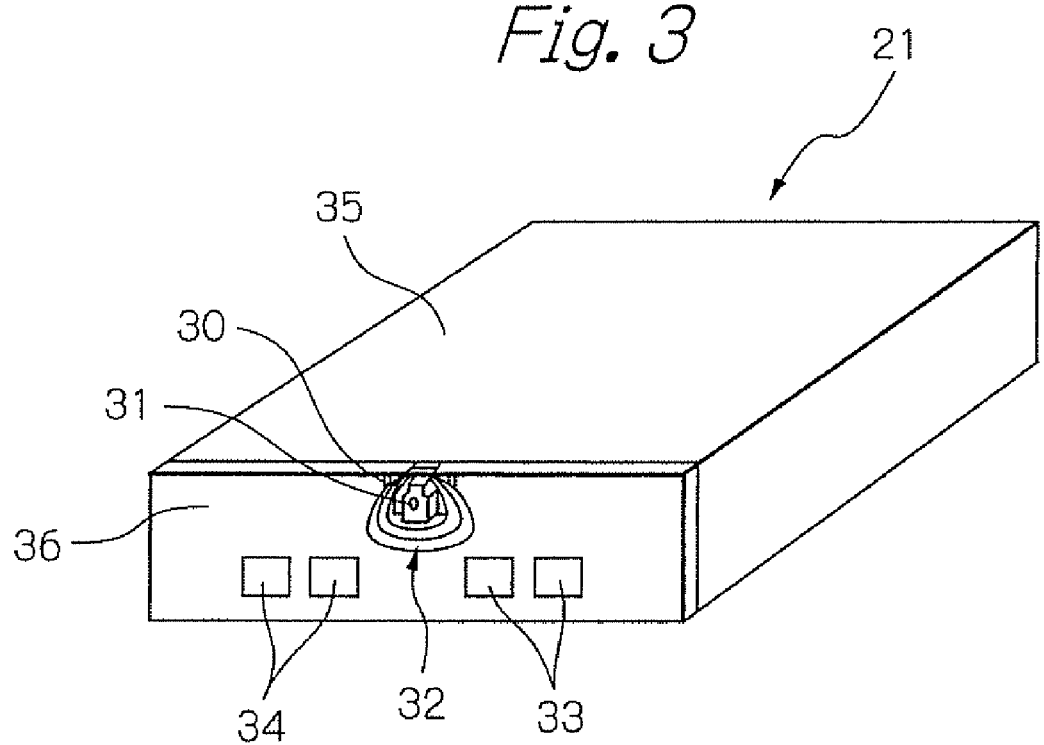
FIG. 3 is a perspective view illustrating a composite thin-film magnetic head mounted at an end section of the HGA of FIG. 2.
Figure 4:
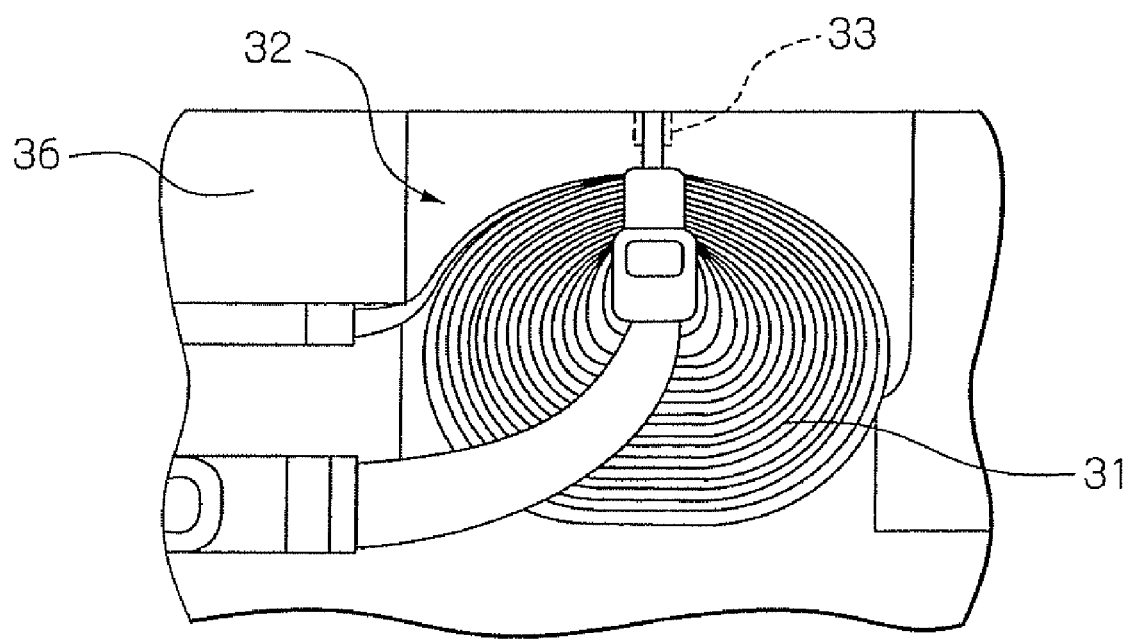
FIG. 4 is a plane view illustrating a magnetic head part of the composite thin-film magnetic head of FIG. 3, when viewed from an element forming surface side of a slider substrate.

FIG. 1 schematically illustrates the main structure of a magnetic disk drive apparatus according to an embodiment of the present invention. FIG. 2 illustrates an example of the structure of an HGA of FIG. 1. FIG. 3 illustrates the composite thin-film magnetic head mounted at the end of the HGA of FIG. 2. FIG. 4 illustrates the magnetic head element part of the composite thin-film magnetic head of FIG. 3, viewed from an element forming surface side of a slider substrate.

In FIG. 1, a reference numeral 10 denotes a plurality of magnetic disks that rotates about the rotary axis of a spindle motor 11, 12 denotes an assembly carriage device for positioning the composite thin-film magnetic head or magnetic head slider on the track, and 13 denotes a read/write control circuit for controlling the read/write operation of the thin-film magnetic head, respectively.

The assembly carriage device 12 includes a plurality of drive arms 14. The drive arms 14 are swingable about a pivot-bearing axis 16 by a voice coil motor (VCM) 15, and are stacked in a direction along this axis 16. Each of the drive arms 14 has an HGA 17 mounted at an end section thereof.

The HGA 17 includes a magnetic head slider 21 facing the surface of each magnetic disk 10. In modifications, the magnetic disk drive apparatus may include only a single magnetic disk 10, drive arm 14 and HGA 17.

As shown in FIG. 2, in the HGA, the magnetic head slider 21 is fixed onto an end section of a suspension 20. The magnetic head slider 21 has a TMR read head element and an inductive write head element. Further, a terminal electrode of the magnetic head slider 21 is electrically connected to an end of a wiring member 25.

The suspension 20 includes mainly a load beam 22, a flexure 23, a base plate 24 and the wiring member 25. The load beam 22 generates a load to be applied to the magnetic head slider 21. The flexure 23 having elasticity is fixed onto and supported by the load beam 22. The base plate 24 is arranged on the base of the load beam 22. The wiring member 25 is arranged on the flexure 23 and the load beam 22, and includes lead conductors and connection pads electrically connected to both ends of the lead conductors.

It is obvious that the structure of the suspension according to the present invention is not limited to the above. Though not illustrated, a head drive IC chip may be mounted in the middle of the suspension 20.

As shown in FIGS. 3 and 4, the magnetic head slider 21 of this embodiment includes a composite thin-film magnetic head 32 and four signal terminal electrodes 33 and 34, on an element formed surface 36 that is one side surface when an air bearing surface (ABS) 35 of the magnetic head slider serves as the bottom surface. The composite thin-film magnetic head 32 includes a TMR read head element 30 and an inductive write head element 31 that are mutually stacked. The four signal terminal electrodes 33 and 34 are connected to the TMR read head element 30 and the inductive write head element 31. The number and positions of these terminal electrodes are not limited to those shown in FIG. 3.

Figure 5:
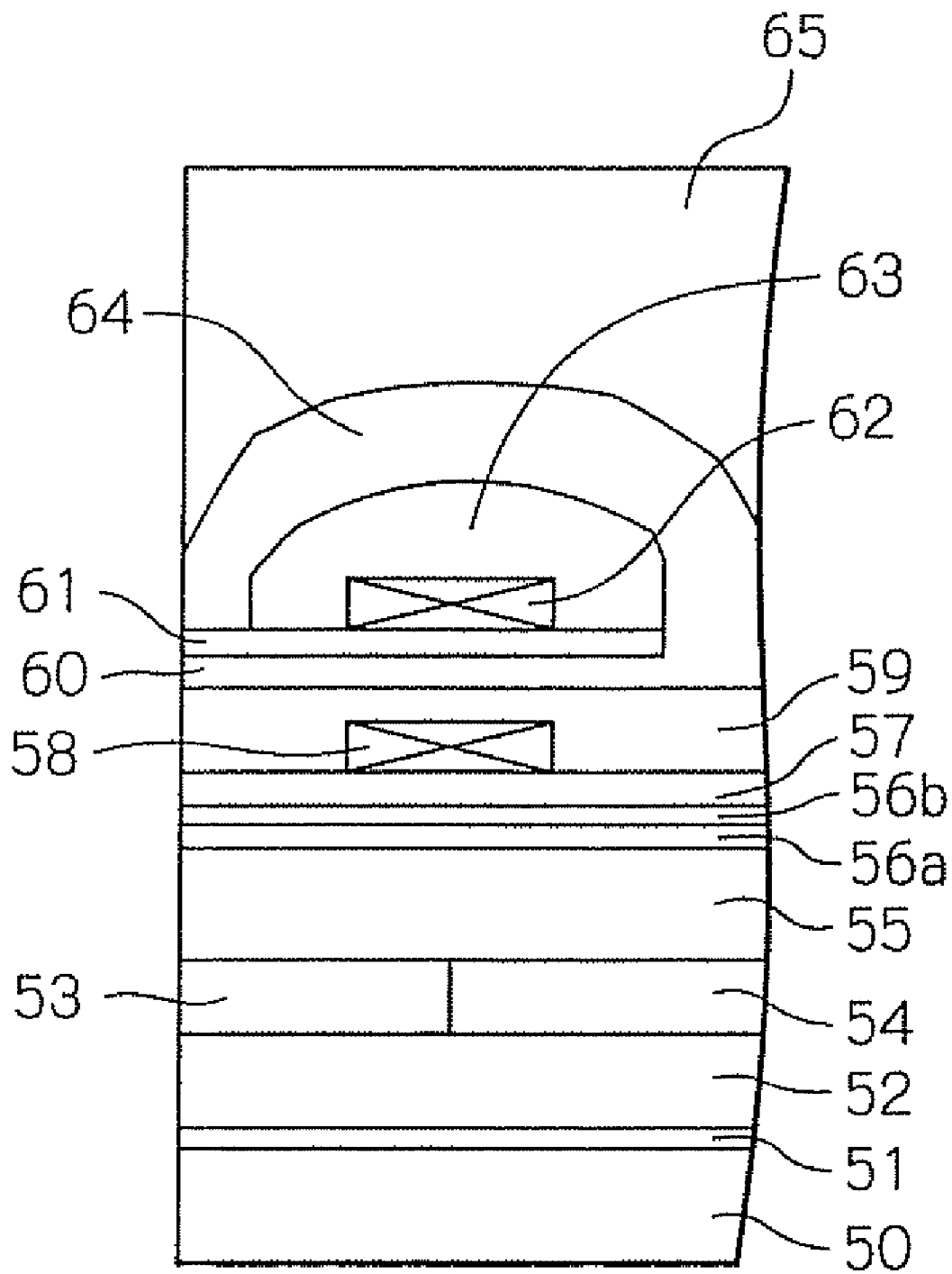
FIG. 5 is a central cross sectional view schematically illustrating the structure of the composite thin-film magnetic head of FIG. 3.

FIG. 5 schematically illustrates the structure of the composite thin-film magnetic head according to this embodiment. FIGS. 6a and 6b schematically illustrate the structure of an MR read head element part of this composite thin-film magnetic head. FIG. 5 shows a cross sectional view in a plane that is perpendicular to the ABS of the composite thin-film magnetic head and also perpendicular to the track width direction. FIGS. 6a and 6b show a central cross sectional view in a plane that is perpendicular to the ABS of the composite thin-film magnetic head and also perpendicular to the track width direction and a sectional view seen from the ABS side.

In this embodiment, the MR read head element consists of a TMR read head element, and the inductive write head element consists of a write head element with a perpendicular magnetic recording structure. However, the inductive write head element may be a write head element with an in-plane or horizontal magnetic recording structure and the MR read head element may be a GMR read head element.

The ABS 35 facing the surface of the magnetic disk is formed on a slider substrate 50 made of a conductive material, such as AlTiC, $Al_2O_3$—TiC (see FIG. 3). In operation, the magnetic head slider 21 hydrodynamically flies above the rotating magnetic disk with a predetermined flying height. An under insulation layer 51 is stacked on the element forming surface 36 of the slider substrate 50. This layer 51 is made of an insulating material, such as alumina ($Al_2O_3$) or silicon oxide ($SiO_2$), with a thickness of about 0.05 to 10 μm. A lower shield layer 52 is stacked on the under insulation layer 51. This layer 52 can serve also as a lower electrode layer made of a metal magnetic material, such as iron aluminum silicon (FeAlSi), nickel iron (NiFe), cobalt iron (CoFe), nickel iron cobalt (NiFeCo), iron nitride (FeN), iron zirconium nitride (FeZrN), iron tantalum nitride (FeTaN), cobalt zirconium niobium (CoZrNb) or cobalt zirconium tantalum (CoZrTa). A TMR multi-layer 53 and an insulation layer 54 made of an insulating material, such as $Al_2O_3$ or $SiO_2$ are stacked on the lower shield layer 52.

The TMR multi-layer 53 has a multi-layered structure of a magnetization fixed function part consisting of a pinned layer and a pinning layer made of an anti-ferromagnetic material, a tunnel barrier layer, and a magnetization free function part. Magnetic domain control layers (not shown in FIG. 5) and the like for controlling the magnetic domain of a free layer are formed on the side end surfaces of the TMR multi-layer 53 in a track-width direction.

An upper shield layer 55 is formed on the TMR multi-layer 53 and the insulation layer 54, and serves also as an upper electrode shield layer made of a metallic magnetic material, such as FeAlSi, NiFe, CoFe, NiFeCo, FeN, FeZrN, FeTaN, CoZrNb or CoZrTa.

The TMR read head element is basically composed of the lower shield layer 52, the TMR multi-layer 53, the insulation layer 54, the upper shield layer 55 and the magnetic domain control layers. The structure of the TMR read head element will more specifically be described later with reference to FIGS. 6a and 6b.

An inductive write head element is formed on the TMR read head element through an insulation layer 56a and a soft magnetic layer 56b. The inductive write head element includes an insulation layer 57, a backing coil layer 58, a backing coil insulation layer 59, a main magnetic pole layer 60, an insulation gap layer 61, a write coil layer 62, a write coil insulation layer 63 and an auxiliary magnetic pole layer 64. The insulation layer 57 is made of an insulating material, such as $Al_2O_3$ or $SiO_2$. The backing coil layer 58 is made of a conductive material, such as copper (Cu), etc. The backing coil insulation layer 59 is made, for example, of a heat-cured resist of novolac type. The main magnetic pole layer 60 is formed of a single layer film of a metallic magnetic material, such as FeAlSi, NiFe, CoFe, NiFeCo, FeN, FeZrN, FeTaN, CoZrNb or CoZrTa, or formed of a multi-layer film of any of these materials. The insulation gap layer 61 is made of an insulating material, such as $Al_2O_3$ or $SiO_2$. The write coil layer 62 is made of a conductive material, such as Cu. The insulation layer 63 is made, for example, of a heat-cured resist of novolac type. The auxiliary magnetic pole layer 64 is formed of a single layer film of a metallic magnetic material, such as FeAlSi, NiFe, CoFe, NiFeCo, FeN, FeZrN, FeTaN, CoZrNb or CoZrTa, or formed of a multi-layer film of any of these materials. A protective layer 65 made of $Al_2O_3$ or $SiO_2$, etc. is arranged on the inductive write head element.

The structure of the TMR read head element according to this embodiment will now be described with reference to FIGS. 6a and 6b.

As will be understood from these figures, within a front region exposed to the ABS that is a magnetically sensitive surface of the TMR read head element, located at a front side in the MR height direction, only a magnetization free function part 66 and magnetic domain-control bias function parts 69 are stacked on the lower shield layer 52 but no tunnel barrier layer (nonmagnetic intermediate layer) 67 nor magnetization fixed function part 68 are formed. These tunnel barrier layer 67 and magnetization fixed function part 68 are formed only within a back region opposite to the ABS, located at a rear side in the MR height direction. A sense current of the TMR read head element will flows in this example through the upper shield layer 55, a gap adjustment layer 70 described later, the magnetization fixed function part 68, the tunnel barrier layer 67, the magnetization free function part 66 and the lower shield layer 52.

Within the front side region in the MR height direction, a free buffer layer 66a, a free layer 66b and an upper insulation layer 66c are sequentially stacked in this order on the lower shield layer 52 as the magnetization free function part 66.

The free buffer layer 66a is a layer for controlling a crystalline state of a material of the free layer and also for adjusting a distance between the free layer 66b and the lower shield layer 52. This free buffer layer 66b is made of a nonmagnetic material appropriately determined depending upon the material of the free layer 66b and upon its necessary thickness. In a desired embodiment, the free buffer layer 66a is formed by depositing for example a nickel chromium (NiCr) material to have a thickness of about 2 to 8 nm. In modifications, the free buffer layer 66a may be formed as a two-layer structure by stacking a ruthenium (Ru) layer on a tantalum (Ta) layer.

The free layer 66b is formed, if it is formed in a single layer structure, by depositing a ferromagnetic alloy material of for example CoFe, cobalt iron boron (CoFeB) or NiFe to have a thickness of about 2 to 8 nm. In case that the tunnel barrier layer 67 is formed by magnesium oxide (MgO), it is desired to make the free layer 66b by CoFeB as a material for accelerating its crystallization and for improving the MR change rate. If it is formed in a two-layered structure, the free layer 66b is configured by depositing for example a CoFe layer with a thickness of about 1 to 3 nm on a NiFe layer with a thickness of about 3 to 5 nm. Since a thickness of the tunnel barrier layer 67 decreases toward the upper end of a side wall of the magnetization free function part 66 causing the current flowing through the tunnel barrier layer to increase, according to the present invention, the upper side layer of the free layer 66b is preferably made of a material, such as CoFe, having a higher MR change ratio and the lower side layer thereof is preferably made of a material, such as NiFe, capable of improving a soft magnetic performance of the free layer.

The upper insulation layer 66c is a layer for insulating the free layer 66b from the upper shield layer 55 and thus can be formed by any kind of insulation material with a certain thickness if this material with the thickness provides an enough high resistance against the tunnel barrier layer 67. For example, the upper insulation layer 66c may be formed by depositing an insulation material such as $Al_2O_3$ to have a thickness of about 3 to 8 nm.

Within a back region opposite to the ABS, located at a rear side in the MR height direction, the tunnel barrier layer 67 is stacked to make contact with a magnetically sensitive surface, that is a surface opposite to the ABS, of the magnetization free function part 66 and with a top surface of the lower shield layer 52. In this embodiment, therefore, the tunnel barrier layer 67 serves as a lower insulation layer to make insulation with the lower shield layer 52. Of course, the tunnel barrier layer 67 serves to provide a tunneling current flowing there through between the free layer 66b and the pinned layer 68a for presenting MR change. This tunnel barrier layer 67 may be made of oxide or nitride of for example aluminum (Al), magnesium (Mg), titanium (Ti) or zinc (Zn). Because it is desired that the tunnel barrier layer 67 has a good insulation properties at its lower part and a low resistance at its side wall, the lower part will be formed thick and the side part will be formed thin. A layer with such uneven thickness will be obtained using a sputtering process directed perpendicular to the substrate surface. It is desired that the thickness of the tunnel barrier layer 67, although it depends upon the material used, is approximately around 1 to 3 nm at the side part and approximately around 5 to 8 nm at the lower part.

Within the rear side region in the MR height direction, a pinned layer 68a and a pinning layer 68b are sequentially stacked in this order on the tunnel barrier layer 67 as the magnetization fixed function part 68.

The pinned layer 68a is a layer with a magnetization direction that will not be changed in response to external magnetic field applied thereto, and this layer is formed by depositing a ferromagnetic alloy material such as CoFe to have a thickness of about 2 to 8 nm. In order to increase the fixing strength of the magnetization, the pinned layer 68a may be formed in a synthetic structure by depositing for example an Ru layer with a thickness of about 0.8 nm on a CoFe layer with a thickness of about 3 nm, and then depositing a CoFe layer with a thickness of about 2 nm on the Ru layer. However, according to the present invention, it is possible that the magnetization fixed function part 68 is formed in a shape with an enough long height direction length to obtain a large magnetic shape anisotropy. Thus, a fixing magnetization in the pinned layer stronger than that in the pinned layer of the conventional GMR or TMR element can be easily obtained, and therefore it may be not necessarily to make the pinned layer in the synthetic structure.

The pinning layer 68b is a layer for fixing the magnetization of the pinned layer 68a by performing exchange coupling with the pinned layer and is made of an anti-ferromagnetic material. The pinning layer 68b is formed by depositing for example platinum manganese (PtMn) to have a thickness of about 10 to 20 nm or iridium manganese (IrMn) to have a thickness of about 5 to 10 nm. It should be noted that if the fixing strength of magnetization of the pinned layer 68a is strong enough, no pinning layer is to be provided.

Within the front region located the front side in the MR height direction, a bias insulation layer 69a, a bias buffer layer 69b and a bias layer 69c are sequentially stacked in this order as the magnetic domain-control bias function parts 69, on both side surfaces in the track width direction of the magnetization free function part 66 and on the top surface of the lower shield layer 52.

The bias insulation layer 69a is formed by depositing for example an insulation material such as $Al_2O_3$ to have a thickness of about 3 to 10 nm.

The bias buffer layer 69b is a layer for controlling a crystalline state of a bias material to provide a good crystalline bias layer. If it is possible to directly form a good crystalline bias layer on the bias insulation layer 69a, no bias buffer layer is needed to provide.

The bias layer 69c is a layer for producing a longitudinal direction bias magnetic field to perform magnetic domain control of the free layer. This bias layer 69c is made of for example a hardware magnet material such as cobalt platinum (CoPt).

The gap adjustment layer 70 is stacked between the magnetization free function part 66 and the upper shield layer 55, between each magnetic domain control bias function part 69 and the upper shield layer 55, and between the magnetization fixed function part 68 and the upper shield layer 55. This gap adjustment layer 70 is a layer for adjusting a distance between the upper shield layer 55 and the free layer 66b and for cutting off magnetic coupling between the bias layer 68b and the upper shield layer 55. The gap adjustment layer 70 is made of any kind of nonmagnetic conductive material. For example, the layer 70 is formed by depositing NiCr to have a thickness of about 2 to 5 nm. On this gap adjustment layer 70, the upper shield layer 55 is stacked.

FIGS. 7a to 7d illustrate a part of manufacturing process of the TMR read head element part of the composite thin-film magnetic head of FIG. 3. Hereinafter, the manufacturing process will be described with reference to these drawings.

Figure 7A:
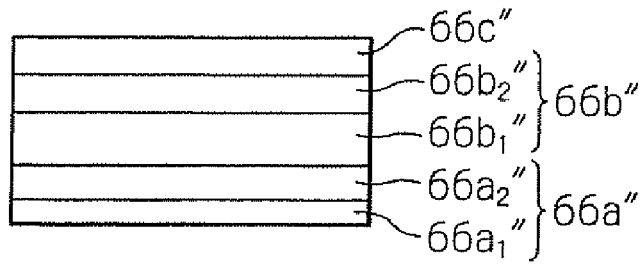
FIGS. 7a to 7d are cross sectional views illustrating a part of manufacturing process of the MR read head element part of the composite thin-film magnetic head of FIG. 3.

As shown in FIG. 7a, films 66a" for the free buffer layer with a two-layered structure formed by stacking a film $66a_2$" for an Ru layer on a film $66a_1$" for a Ta layer are deposited by sputtering on the lower shield layer 52. Then, films 66b" for the free layer with a two-layered structure formed by stacking a film $66b_2$" for a CoFe layer on a film $66b_1$" for a NiFe layer are deposited by sputtering thereon. Thereafter, a film 66c" made of $Al_2O_3$ for the upper insulation layer is deposited by sputtering thereon.

Figure 7B:
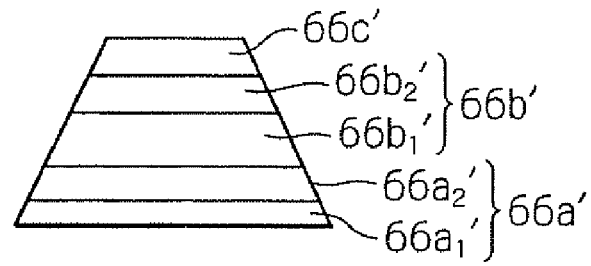

Then, as shown in FIG. 7b, a length in the height direction of thus stacked films is defined by ion milling. By performing this defining process, obtained is multi layer that has inclined surfaces at both sides in the MR height direction and has two-layered structure films 66a' for the free buffer layer formed by stacking a film $66a_2$' for the Ru layer on a film $66a_1$' for the Ta layer, two-layered structure films 66b' for the free layer formed by stacking a film $66b_2$' for the CoFe layer on a film $66b_1$' for the NiFe layer, and a film 66c' for the upper insulation layer.

Figure 7C:
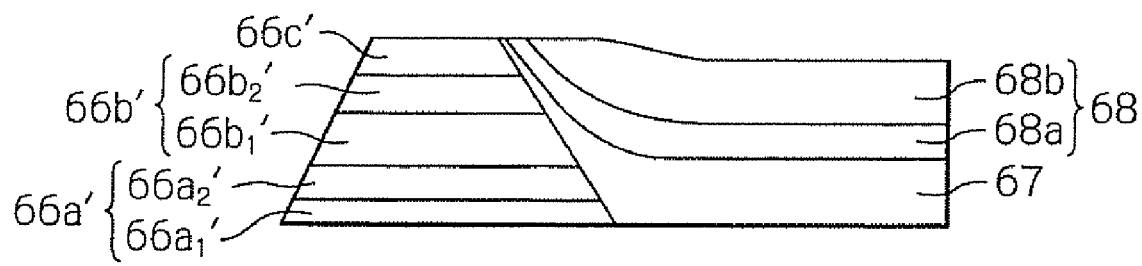

Then, as shown in FIG. 7c, the tunnel barrier layer 67 and the magnetization fixed function part 68 configured by the pinned layer 68a and the pinning layer 68b are sequentially stacked by vertically oriented sputtering on the inclined surface within the back region located at the rear side in the MR height direction.

Figure 7D:
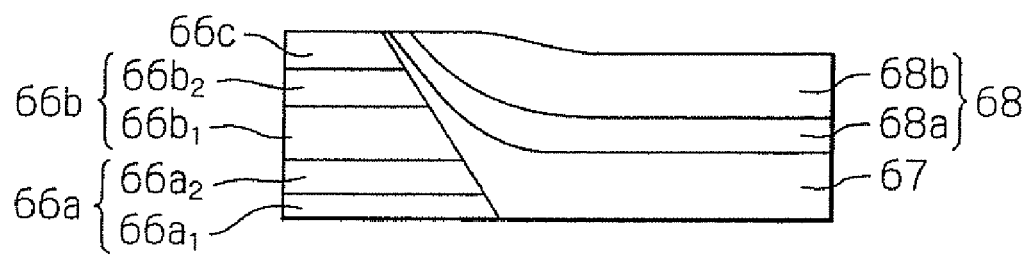

Then, an upper shield layer and an inductive write head element are formed thereon and thus the wafer process is completed. Thereafter, the wafer is cut to separate into a plurality of row bars and then one side surface of each row bar is lapped to obtain multi layer having the lapped surface or ABS as shown in FIG. 7d. The multi layer has the two-layered structure free buffer layer 66a with the Ru layer $66a_2$ stacked on the Ta layer $66a_1$, the two-layered structure free layer 66b with the CoFe layer $66b_2$ stacked on the NiFe layer $66b_1$, and the upper insulation layer 66c is formed within the front side region in the MR height direction or the region exposed to the ABS. The tunnel barrier layer 67, and the magnetization fixed function part 68 configured by the pinned layer 68a and the pinning layer 68b are formed within the rear side region in the MR height direction or the region opposite to the ABS. The tunnel barrier layer 67 is in contact with the surface opposite to the ABS, of the magnetization free function part 66.

As described in detail above, according to this embodiment, since the tunnel barrier layer 67 and the magnetization fixed function part 68 stacked on the tunnel barrier layer 67 are formed only within the rear side region in the height direction, a thickness of the magnetization fixed function part 68 has a little effect on the read gap, so that the read gap can be more narrowed. Also, because bias magnetic field from the magnetic domain control bias function parts 69 located at the side regions in the track-width direction is hardly applied to the magnetization fixed function part 68 and because a magnetic field from the magnetization fixed function part 68 is hardly applied to the magnetic domain control bias function parts 69, the fixing magnetization in the magnetization fixed function part 68 in particular in the pinned layer 68a can be more stabilized. As are result, excellent element output characteristics can be obtained.

In the aforementioned embodiment, the TMR read head element is used as an MR read head element. However, in modifications, a GMR read head element may be used as the MR read head element. In the latter case, as the nonmagnetic intermediate layer, a conductive spacer layer may be used instead of the tunnel barrier layer.

The present invention is applicable to a magnetic memory such as an MRAM cell instead of the TMR read head element. The MRAM cell has a TMR structure configured by sequentially stacking a magnetization fixed layer, a tunnel barrier layer, a magnetization free layer, and an upper conductive layer that constitutes the word line on a lower conductive layer that constitutes the bit line.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A magnetoresistive effect element comprising:
   a lower shield layer;
   a magnetization free function part stacked on said lower shield layer;
   an upper shield layer stacked on said magnetization free function part;
   a nonmagnetic intermediate layer stacked on a surface, that is opposite to a magnetically sensitive surface, of said magnetization free function part; and
   a magnetization fixed function part stacked on said nonmagnetic intermediate layer,
   said nonmagnetic intermediate layer and said magnetization fixed function part being formed only within an outer region of said magnetization free function part, located opposite side to said magnetically sensitive surface.

2. The magnetoresistive effect element as claimed in claim 1, wherein said magnetoresistive effect element is configured so that a sense current flows through said magnetization fixed function part, said nonmagnetic intermediate layer, said magnetization free function part and said lower shield layer.

3. The magnetoresistive effect element as claimed in claim 1, wherein said magnetization fixed function part comprises a pinned layer stacked on said nonmagnetic intermediate layer, and a pinning layer stacked on said pinned layer and exchange-coupled with said pinned layer.

4. The magnetoresistive effect element as claimed in claim 1, wherein said nonmagnetic intermediate layer comprises a nonmagnetic intermediate layer also serving as a lower insulation layer stacked on the surface, that is opposite to the magnetically sensitive surface, of said magnetization free function part and on said lower shield layer.

5. The magnetoresistive effect element as claimed in claim 1, wherein said nonmagnetic intermediate layer comprises a tunnel barrier layer or a conductive spacer layer.

6. The magnetoresistive effect element as claimed in claim 1, wherein said magnetization free function part comprises a free buffer layer stacked on said lower shield layer, a free layer stacked on said free buffer layer and an upper insulation layer stacked on said free layer.

7. The magnetoresistive effect element as claimed in claim 1, wherein said magnetoresistive effect element further comprises magnetic domain control bias function parts stacked on both side end surfaces of said magnetization free function part in a track-width direction.

8. The magnetoresistive effect element as claimed in claim 7, wherein each of said magnetic domain control bias function parts comprises a bias insulation layer, a bias buffer layer stacked on said bias insulation layer and a bias layer stacked on said bias buffer layer.

9. The magnetoresistive effect element as claimed in claim 1, wherein said magnetoresistive effect element further comprises a gap adjustment layer stacked between said magnetization fixed function part and said upper shield layer.

10. The magnetoresistive effect element as claimed in claim 8, wherein said gap adjustment layer is formed also between said magnetization free function part and said upper shield layer and between said magnetic domain control bias function part and said upper shield layer.

11. A thin-film magnetic head with a magnetoresistive effect read head element comprising:
    a lower shield layer;
    a magnetization free function part stacked on said lower shield layer;
    an upper shield layer stacked on said magnetization free function part;
    a nonmagnetic intermediate layer stacked on a surface, that is opposite to a magnetically sensitive surface, of said magnetization free function part; and
    a magnetization fixed function part stacked on said nonmagnetic intermediate layer,
    said nonmagnetic intermediate layer and said magnetization fixed function part being formed only within an outer region of said magnetization free function part, located opposite side to said magnetically sensitive surface.

12. The thin-film magnetic head as claimed in claim 11, wherein said magnetoresistive effect element is configured so that a sense current flows through said magnetization fixed function part, said nonmagnetic intermediate layer, said magnetization free function part and said lower shield layer of said magnetoresistive effect read head element.

13. The thin-film magnetic head as claimed in claim 11, wherein said magnetization fixed function part of said magnetoresistive effect read head element comprises a pinned layer stacked on said nonmagnetic intermediate layer, and a pinning layer stacked on said pinned layer and exchange-coupled with said pinned layer.

14. The thin-film magnetic head as claimed in claim 11, wherein said nonmagnetic intermediate layer of said magnetoresistive effect read head element comprises a nonmagnetic intermediate layer also serving as a lower insulation layer stacked on the surface, that is opposite to the magnetically sensitive surface, of said magnetization free function part and on said lower shield layer.

15. The thin-film magnetic head as claimed in claim 11, wherein said nonmagnetic intermediate layer of said magnetoresistive effect read head element comprises a tunnel barrier layer or a conductive spacer layer.

16. The thin-film magnetic head as claimed in claim 11, wherein said magnetization free function part of said magnetoresistive effect read head element comprises a free buffer layer stacked on said lower shield layer, a free layer stacked on said free buffer layer and an upper insulation layer stacked on said free layer.

17. The thin-film magnetic head as claimed in claim 11, wherein said magnetoresistive effect head element further comprises magnetic domain control bias function parts stacked on both side end surfaces of said magnetization free function part of said magnetoresistive effect read head element in a track-width direction.

18. The thin-film magnetic head as claimed in claim 17, wherein each of said magnetic domain control bias function parts of said magnetoresistive effect read head element comprises a bias insulation layer, a bias buffer layer stacked on said bias insulation layer and a bias layer stacked on said bias buffer layer.

19. The thin-film magnetic head as claimed in claim 11, wherein said magnetoresistive effect head element further comprises a gap adjustment layer stacked between said magnetization fixed function part and said upper shield layer of said magnetoresistive effect read head element.

20. The thin-film magnetic head as claimed in claim 18, wherein said gap adjustment layer is formed also between said magnetization free function part and said upper shield layer of said magnetoresistive effect read head element, and between said magnetic domain control bias function part and said upper shield layer of said magnetoresistive effect read head element.

21. The thin-film magnetic head as claimed in claim 11, wherein said thin-film magnetic head further comprises an inductive write head element formed on said upper shield layer of said magnetoresistive effect read head element.

22. A magnetic disk drive apparatus including a magnetic disk, at least one thin-film magnetic head, and a support mechanism for supporting said at least one thin-film magnetic head so as to face a surface of said magnetic disk, said at least one thin-film magnetic head has a magnetoresistive effect head element comprising:
  a lower shield layer;
  a magnetization free function part stacked on said lower shield layer;
  an upper shield layer stacked on said magnetization free function part;
  a nonmagnetic intermediate layer stacked on a surface, that is opposite to a magnetically sensitive surface, of said magnetization free function part; and
  a magnetization fixed function part stacked on said nonmagnetic intermediate layer,
  said nonmagnetic intermediate layer and said magnetization fixed function part being formed only within an outer region of said magnetization free function part, located opposite side to said magnetically sensitive surface.

23. The magnetic disk drive apparatus as claimed in claim 22, wherein said magnetoresistive effect element is configured so that a sense current flows through said magnetization fixed function part, said nonmagnetic intermediate layer, said magnetization free function part and said lower shield layer of said magnetoresistive effect read head element.

24. The magnetic disk drive apparatus as claimed in claim 22, wherein said magnetization fixed function part of said magnetoresistive effect read head element comprises a pinned layer stacked on said nonmagnetic intermediate layer, and a pinning layer stacked on said pinned layer and exchange-coupled with said pinned layer.

25. The magnetic disk drive apparatus as claimed in claim 22, wherein said magnetoresistive effect head element further comprises magnetic domain control bias function parts stacked on both side end surfaces of said magnetization free function part of said magnetoresistive effect read head element in a track-width direction.

* * * * *